US006805809B2

(12) United States Patent
Nuzzo et al.

(10) Patent No.: US 6,805,809 B2
(45) Date of Patent: Oct. 19, 2004

(54) DECAL TRANSFER MICROFABRICATION

(75) Inventors: Ralph G. Nuzzo, Champaign, IL (US); William Robert Childs, Champaign, IL (US)

(73) Assignee: Board of Trustees of University of Illinois, Urbana, IL (US)

(*) Notice: Subject to any disclaimer, the term of this patent is extended or adjusted under 35 U.S.C. 154(b) by 0 days.

(21) Appl. No.: 10/230,882

(22) Filed: Aug. 28, 2002

(65) Prior Publication Data

US 2004/0040653 A1 Mar. 4, 2004

(51) Int. Cl.⁷ .......................... C03C 25/68; B44C 1/165
(52) U.S. Cl. ........................................ 216/54; 156/230
(58) Field of Search .............................. 216/41, 43, 48, 216/33, 36, 54; 156/230, 234; 427/515, 516; 264/1.38, 2.3, 2.6

(56) References Cited

U.S. PATENT DOCUMENTS

| | | | |
|---|---|---|---|
| 3,764,248 A | 10/1973 | Hall | |
| 4,126,292 A | 11/1978 | Saeki et al. | |
| 5,071,597 A | 12/1991 | D'Amato et al. | |
| 5,502,144 A | 3/1996 | Kuo et al. | |

(List continued on next page.)

FOREIGN PATENT DOCUMENTS

WO    WO 01/18857 A1    3/2001

OTHER PUBLICATIONS

Allcock, Harry R. et al., *Contemporary Polymer Chemistry*, published by Prentice–Hall, Inc. New jersey, copyright 1990, pp. 146–149.

Deng, Tao et al., "Prototyping of Masks, Masters and Stamps/Molds for Soft Lithography Using an Office Printer and Photographic Reduction", *Anal. Chem.*, vol. 72, No. 14, 2000, pp 3176–3180.

Deng Tao et al., Using Patterns in Microfiche as Photomasks in 10–μm–Scale Microfabrication:, *Langmuir*, vol. 15, 1999, pp. 6575–6581.

Douki, Katsuji et al., "High–Performance 193–m Positive Resist Using Alternating Polymer System for Functionalized Cyclic Olefins / Maleic Anhydride", *Proceedings of SPIE*, vol. 3999, 2000, pp 1128–1133.

Ouyang, M. et al., "Conversion of Some Siloxane Polymers to Silicon Oxide by UV/Ozone Photochemical Processes", *Chem. Mater*, vol. 12, 2000, pp. 1591–1596.

Stevens, Malcolm P., *Polymer Chemistry*, published by Oxford University Press, New York, N.Y., 1999, pp. 276–279.

Xia, Younan et al., "Soft Lithography", *Annu. Rev. Mater. Sci.*, vol. 28, 1998, pp. 153–184.

International Search Report for corresponding Patent Cooperation Treaty application No. PCT/US03/26751, 7 pages.

*Primary Examiner*—Gregory Mills
*Assistant Examiner*—Roberts P. Culbert
(74) *Attorney, Agent, or Firm*—Brinks Hofer Gilson & Lione

(57) ABSTRACT

A method of making a microstructure includes forming a pattern in a surface of a silicon-containing elastomer, oxidizing the pattern, contacting the pattern with a substrate; and bonding the oxidized pattern and the substrate such that the pattern and the substrate are irreversibly attached. The silicon-containing elastomer may be removably attached to a transfer pad.

53 Claims, 10 Drawing Sheets

U.S. PATENT DOCUMENTS

| | | | |
|---|---|---|---|
| 5,534,609 A | | 7/1996 | Lewis et al. |
| 5,538,674 A | | 7/1996 | Nisper et al. |
| 5,618,903 A | | 4/1997 | Hoxmeier et al. |
| 5,637,668 A | | 6/1997 | Graiver et al. |
| 5,661,092 A | * | 8/1997 | Koberstein et al. ......... 427/515 |
| 5,670,598 A | | 9/1997 | Leir et al. |
| 5,676,983 A | | 10/1997 | Bacher et al. |
| 5,741,859 A | | 4/1998 | Saxena et al. |
| 5,744,541 A | | 4/1998 | Sawaguchi et al. |
| 5,795,519 A | | 8/1998 | Bacher et al. |
| 5,932,649 A | | 8/1999 | Hergenrother et al. |
| 5,932,677 A | | 8/1999 | Hoover et al. |
| 6,007,914 A | | 12/1999 | Joseph et al. |
| 6,013,711 A | | 1/2000 | Lewis et al. |
| 6,013,715 A | | 1/2000 | Gornowicz et al. |
| 6,033,202 A | | 3/2000 | Bao et al. |
| 6,072,011 A | | 6/2000 | Hoover |
| 6,090,902 A | | 7/2000 | Kuo et al. |
| 6,103,837 A | | 8/2000 | Hiiro et al. |
| 6,124,411 A | | 9/2000 | Matyjaszewski et al. |
| 6,136,926 A | | 10/2000 | Raetzsch et al. |
| 6,153,691 A | | 11/2000 | Gornowicz et al. |
| 6,235,863 B1 | | 5/2001 | Hoxmeier |
| 6,339,131 B1 | | 1/2002 | Cella et al. |
| 6,344,521 B1 | | 2/2002 | Schwindeman et al. |
| 6,362,288 B1 | | 3/2002 | Brewer et al. |
| 6,363,183 B1 | | 3/2002 | Koh |
| 6,372,532 B2 | | 4/2002 | Bao et al. |
| 6,403,710 B1 | | 6/2002 | Ahmed et al. |
| 6,407,193 B1 | | 6/2002 | Hiiro et al. |
| 6,663,820 B2 | * | 12/2003 | Arias et al. .................. 264/496 |
| 2002/0054862 A1 | | 5/2002 | Perron et al. |
| 2003/0024632 A1 | * | 2/2003 | Hahn et al. .................. 156/230 |

* cited by examiner

DECAL TRANSFER MICROFABRICATION

FEDERALLY SPONSORED RESEARCH OR DEVELOPMENT

The subject matter of this application was in part funded by the National Science Foundation (Grant no. CHE 0097096); by the Defense Advanced Research Projects Agency (DARPA; Grant no. SPAWAR: N6600198-1-8915); and by the Department of Energy (DOE Grant no. DEFG02-91ER45439). The government may have certain rights in this invention.

BACKGROUND

Soft lithography is a versatile patterning technique for use in microfabrication to produce microstructures. This technique uses a patterned elastomer to transfer a pattern from a master to a substrate. The patterned elastomer may be used, for example, as a stamp to transfer a substance, as a mold to be filled by a substance, or as a mask to provide for selective deposition onto a substrate and/or selective removal of material from the substrate. See, for example, Xia, Y. and Whitesides, G. M. *Annu. Rev. Mater. Sci.* (1998) 28:153–184.

In contrast, conventional photolithography utilizes rigid photomasks to pattern photoresist layers, and the patterned photoresist then protects the material beneath the pattern during subsequent etching and deposition steps. Soft lithography provides a number of advantages over conventional photolithography. Soft lithography can yield three-dimensional structures and non-planar structures in a single deposition step, rather than requiring the stepwise assembly of individual layers. Due to the mechanical flexiblility of the elastomer, non-planar substrates can be patterned. The various soft lithographic techniques can also be used with a more diverse range of materials than are available with photolithography, and the materials and techniques used in soft lithography are typically much lower in cost. Because of these advantages, soft lithography has proven useful for applications including integrated optics, microelectromechanical systems (MEMS), microfluidics, and patterning of biological material such as proteins, nucleic acids and cells.

In one example, a patterned elastomeric stamp can be contacted with a substrate to form channels which can exhibit a pattern in two or three dimensions. The channels can then be filled with a liquid precursor for a solid substance, such as a polymer or a ceramic. The channels can also be used to mix different fluid substances, thus functioning as a microreactor or a microanalytical tool. The formation of solid patterned structures with this technique is referred to as Micromolding In Capillaries, or "MIMIC." Drawbacks to this technique include the need for the pattern to be continuous to allow the entire pattern to be filled. Also, the channels must be large enough to accommodate the viscosity of the liquid used to fill the pattern, which can limit the resolution that can be obtained.

In another example, a patterned elastomeric stamp can be coated with a substance and then contacted with a substrate. Removal of the stamp results in a deposition of the substance onto the substrate in the pattern of the stamp. The substance which is transferred thus functions as an ink which is printed onto the substrate. This technique, referred to as microcontact printing or "$\mu$CP," can be used to form discontinuous patterns, and can form patterns with higher resolution than MIMIC. Applications of microcontact printing typically involve additive lithography, which is the selective deposition of another substance on either the patterned ink or on the exposed substrate. Drawbacks to this technique include the limited range of materials which can be used as the substrate and as the ink.

In yet another example, a patterned elastomeric membrane can be applied to a substrate. This membrane can then function as a mask for selective removal of the exposed substrate (subtractive lithography), or for additive lithography. Depending on the materials used for the membrane and the substrate, reversible bonding between the two can be used to stabilize the membrane during the desired microfabrication and to remove the membrane once it has served its intended purpose. Drawbacks to this technique include the extreme difficulty in applying, removing, and manipulating the thin elastomeric membrane. Also, the membrane must be continuous and cannot be used for imaging discrete forms and patterns.

It is thus desirable to provide an improved soft lithographic technique that can be used to form patterns that are continuous or discrete, two dimensional or three dimensional, on planar and non-planar substrates, and that may be in the form of channels or masks for additive and subtractive lithography. It is also desirable that these patterns can be formed on and with a wide range of substances, without the need for delicate handling of the materials involved.

BRIEF SUMMARY

In a first embodiment of the invention, there is provided a method of making a microstructure, the method comprising forming a pattern in a surface of a silicon-containing elastomer; oxidizing the pattern; contacting the pattern with a substrate; and bonding the oxidized pattern and the substrate such that the pattern and the substrate are irreversibly attached.

In a second embodiment of the invention, there is provided a method of making a microstructure, the method comprising oxidizing a first surface of a film comprising a silicon-containing elastomer; wherein the first surface comprises a pattern, and the film is attached to a transfer pad; contacting the pattern with a substrate; bonding the pattern and the substrate such that the pattern and the substrate are irreversibly attached; and separating the transfer pad from the film.

In a third embodiment of the invention, there is provided a microstructure, comprising a substrate; and a patterned silicon-containing elastomer on the substrate. The microstructure is formed by oxidizing the silicon-containing elastomer, contacting the oxidized elastomer with the substrate, and bonding the oxidized elastomer and the substrate such that the elastomer and substrate are irreversibly attached. There is further provided a method of making a microstructure, comprising applying an etching agent to this microstructure to remove a portion of the substrate which is not covered by the patterned silicon-containing elastomer. There is further provided a method of making a microstructure, comprising depositing a material on this microstructure; and removing the patterned silicon-containing elastomer to provide a pattern of the deposited material.

In a fourth embodiment of the invention, there is provided a microstructure, comprising a substrate; a patterned silicon-containing elastomer on the substrate; and a top layer comprising a silicon-containing elastomer. The patterned silicon-containing elastomer is positioned between the substrate and the top layer and comprises empty channels between the substrate and the top layer, and the top layer has a thickness between 100 nanometers and 500 micrometers.

BRIEF DESCRIPTION OF THE DRAWINGS

FIG. 4d is a graph of profilometry data of the pattern of FIG. 4a.

DETAILED DESCRIPTION

Figure 1:
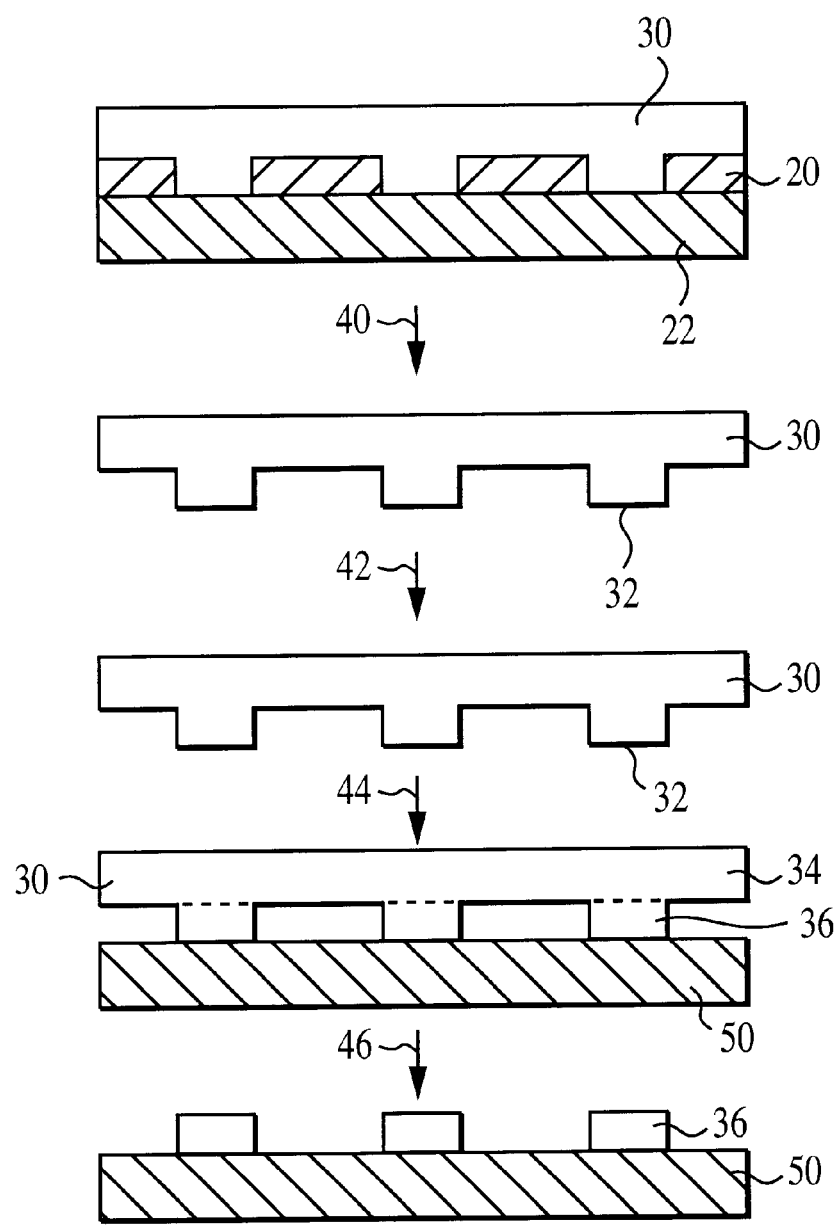
FIG. 1 is a diagram of a pattern transfer method using irreversible attachment.

In a first embodiment of the invention, a method of making a microstructure includes forming a pattern in a surface of a silicon-containing elastomer, oxidizing this pattern, and contacting the oxidized pattern with a substrate. The oxidized pattern and the substrate may be bonded such that the pattern and substrate are irreversibly attached.

In an aspect of the invention, a method for irreversibly attaching a silicon-containing elastomer to a substrate includes oxidation of an exposed surface of a silicon-containing elastomer, followed by contacting the oxidized surface with a substrate and bonding the elastomer to the substrate. The strength of the bond can be greater than the strength of the bond between a layer of the elastomer adjacent the surface and the remaining bulk of the elastomer material.

In a second embodiment of the invention, a method of a making a microstructure includes forming a pattern in a surface of a silicon-containing elastomer, oxidizing the silicon containing elastomer; applying an adhesion control agent to the oxidized elastomer; and removably attaching the oxidized elastomer to a transfer pad material. The method may further include oxidizing the pattern in the surface of the silicon-containing elastomer, contacting the oxidized pattern with a substrate, and bonding the oxidized pattern and the substrate such that the pattern and substrate are irreversibly attached.

In an aspect of the invention, a method for removably attaching a silicon-containing elastomer to a transfer pad material includes oxidation of an exposed surface of a silicon-containing elastomer, combined with treatment of the exposed surface with an adhesion control agent, to provide a surface that will removably attach to a transfer pad. Thus, the elastomer can be supported and manipulated until subjected to a force large enough to remove the elastomer from the transfer pad.

In another aspect of the invention, a method for irreversibly attaching a silicon-containing elastomer to a substrate includes oxidation of an exposed surface of a silicon-containing elastomer, combined with contacting the oxidized surface with the substrate and bonding the oxidized surface with the substrate.

In a third embodiment of the invention, a method of making a microstructure includes oxidizing a first surface of a film comprising a silicon-containing elastomer and contacting the pattern with a substrate. The first surface contains a pattern, and the film is attached to a transfer pad. The method further includes bonding the pattern and the substrate such that the pattern and the substrate are irreversibly attached, and then separating the transfer pad from the film.

In an aspect of the invention, a method of transferring a silicon-containing elastomer film from a transfer pad to a substrate includes oxidizing one surface of a silicon-containing elastomer material, followed by contacting the oxidized surface with a substrate and forming a bond between the elastomer surface and the substrate. Separation of the elastomer material from the substrate results in a partitioning of the elastomer between the bulk elastomer material and a layer of the elastomer adjacent the oxidized surface. Thus, a film of the elastomer remains bonded to the substrate.

In another aspect of the invention, a method of transferring a silicon-containing elastomer film from a transfer pad to a substrate includes removably attaching one surface of a silicon-containing elastomer film to a transfer pad material, followed by irreversibly attaching the other surface of the film to a substrate. Separation of the transfer pad from the substrate results in a removal of the elastomer film from the transfer pad, thus transferring the film from the transfer pad to the substrate.

In yet another aspect of the invention, a method of transferring a pattern from a master to a substrate includes forming a patterned film based on the master, followed by irreversibly attaching the patterned film to the substrate. The patterned film may be a film which is removably attached to a transfer pad, or it may be a layer of a silicon-containing elastomer which is adjacent to a surface that is irreversibly attached to the substrate.

The term "microstructure," as used herein, is defined as a structure or pattern containing features which are 1,000 micrometers ($\mu$m) or smaller. The formation of microstructures is referred to herein as "microfabrication" and includes, but is not limited to, techniques such as microlithography, soft lithography, MIMIC, and self-assembly.

The term "irreversibly attached," as used herein, means that the bonding between two substances is sufficiently strong that the substances cannot be mechanically separated without damaging or destroying one or both of the substances. Substances which are irreversibly attached may be separated by exposure to an appropriate chemical environment, such as chemical reagents or irradiation.

The term "removably attached," as used herein, means that the bonding between two substances is sufficiently weak that the substances can be separated mechanically without significantly damaging either substance.

The term "elastomer," as used herein, is defined as a polymer which can return to its initial dimensions when deformed by an external force. A polymer is considered an elastomer when it meets the following standard. A sample of the polymer in its solid state and having an initial linear dimension $D°$ is subjected to a force such that the dimension is changed by 10%. Once the force is no longer applied, the dimension assumes a value of $D^e$, where $D^e = D° \pm 0.01 D°$.

The term "silicon-containing elastomer," as used herein, is an elastomer which contains silicon (Si) atoms. Examples of silicon-containing elastomers include, but are not limited to, polysiloxanes, such as poly(dimethyl siloxane), poly (methyl siloxane), partially alkylated poly(methyl siloxane), poly(alkyl methyl siloxane) and poly(phenyl methyl siloxane); block copolymers containing segments of a polysiloxane and another polymer; silicon-modified elastomers, such as silicon-modified natural rubber, silicon-modified polyolefins (including silicon-modified polyisoprene, silicon-modified polybutadiene, and silicon-modified polyisobutylene), silicon-modified polyimides, silicon-modified crosslinked phenol-formaldehyde resins (Si-modified NOVOLAC), and silicon-modified polyurethane elastomers. Silicon modification of elastomers may be carried out by reactions with silanes and siloxanes, including hydrosilation and condensation. Preferably the silicon-containing elastomer is a polysiloxane. More preferably, the silicon-containing elastomer is poly(dimethyl siloxane), referred to as "PDMS."

Further examples of silicon-containing elastomers include block copolymers of polysiloxanes with other polymers. For example, block copolymers containing polysiloxanes may be formed with polyolefins such as polyethylene (U.S. Pat. No. 5,618,903, incorporated herein by reference), poly (isobutylene) (U.S. Pat. No. 5,741,859, incorporated herein by reference), polypropylene (U.S. Pat. No. 5,744,541, incorporated herein by reference), polystyrene and various polydienes (U.S. Pat. No. 5,932,649, incorporated herein by reference), and polyisoprene and polybutadiene (U.S. Pat. No. 6,362,288, incorporated herein by reference). In another example, block copolymers containing polysiloxanes may be formed with acrylates (U.S. Pat. No. 6,090,902, incorporated herein by reference), with a wide variety of polymers formed by polymerization of unsaturated monomers (U.S. Pat. No. 6,124,411, incorporated herein by reference), and with a variety of types of siloxanes (U.S. Pat. No. 5,637,668, incorporated herein by reference). In another example, block copolymers containing polysiloxanes may be formed with condensation polymers such as polycarbonates (U.S. Pat. No. 6,072,011, incorporated herein by reference) and poly(arylene ethers) (U.S. Pat. No. 6,339,131, incorporated herein by reference) and may also be formed with polyethers such as polyethylene oxide and polypropylene oxide (U.S. Pat. No. 6,013,711, incorporated herein by reference). Further examples of silicon-containing elastomers include copolymers containing polysiloxane repeat units in combination with polyester and/or polycarbonate repeat units (U.S. Pat. No. 6,407,193, incorporated herein by reference), and also include blends of polysiloxanes with polyamides (U.S. Pat. No. 6,344,521, incorporated herein by reference) and blends of polysiloxanes with polyolefins, polyurethanes, orstyrenic polymers (U.S. Pat. No. 6,153,691, incorporated herein by reference). Further examples of silicon-containing elastomers include polymers modified to contain silicon by treatment with silane compounds (U.S. Pat. No. 6,136,926, incorporated herein by reference).

Oxidation of silicon-containing elastomers can be performed by a variety of methods known in the art. In one method, for example, the elastomer can be exposed to an oxygenated plasma to oxidize the elastomer surface. This oxidation can be carried out by converting a stream of oxygen into a plasma at a temperature as low as 40° C. In another method, which is preferred, oxidation of a surface of a silicon-containing elastomer is performed by exposing the surface to ultraviolet radiation which is sufficient to generate ozone and/or other oxidizing species, such as singlet oxygen, from an ambient atmosphere. This particular oxidation is referred to as UV/Ozone treatment, or "UVO." Oxidation by UVO can also include exposing the surface to an atmosphere enriched in either molecular oxygen ($O_2$) or ozone ($O_3$). One advantage of the oxidation by UVO is that the silicon-containing elastomer can become sufficiently oxidized under mild conditions. See for example Ouyang, M. et al. *Chem. Mater.* 2000, 12, 1591–1596.

The oxidized surface of a silicon-containing elastomer can then be irreversibly attached to the surface of a substrate material by contacting the oxidized surface and the substrate and bonding together the surface and the substrate. Suitable substrates include, but are not limited to, silicon; ceramic materials such as silicon oxide, quartz and glass; polymers such as polystyrene and silicon-containing elastomers, including PDMS; and metals such as titanium, chromium, tungsten, and gold. Preferably, the surface of the silicon-containing elastomer is treated with UVO at ambient temperature for an appropriate length of time and is then immediately contacted with a substrate that has been recently cleaned. For example, PDMS is preferably exposed to UVO for 1–4 minutes, more preferably for 2–3 minutes, and even more preferably for about 2.5 minutes.

The elastomer and substrate are kept in contact to allow the formation of an irreversible bond. The contacted elastomer and substrate may be subjected to heating and/or supplemental ultraviolet radiation to assist the formation of the bond. For example, after contacting UVO treated PDMS with a silicon substrate, the irreversible bond can be obtained by maintaining the contact for about 16 hours at ambient temperature, by maintaining the materials at 70° C. for at least 20 minutes, or by applying UV radiation to the PDMS for at least 30 minutes. Exposure of unoxidized silicon-containing elastomers to only one of heat, ozone or UV radiation will not typically provide irreversible adhesion to substrates.

The initial contact between the oxidized surface of the silicon-containing elastomer and the substrate surface typically will not result in an irreversible bond. This phenomenon allows for the precise positioning of the elastomer and the substrate. Thus, any patterns in the elastomer and/or the substrate can be aligned or registered prior to the formation of an irreversible bond. The use of an optically transparent silicon-containing elastomer (such as PDMS) may also be desirable, in that alignment or registration of films and patterns can be done using optical observation.

It may be desirable to clean the surface of the substrate prior to contacting the substrate with the oxidized silicon-containing elastomer. Substrates may be cleaned by conventional methods. For example, substrates of silicon or silicon oxide can be rinsed with solvents such as hexanes and ethanol and dried under an inert gas such as nitrogen. In another example, glass and quartz can be rinsed with reagents such as piranha (sulfuric acid and hydrogen peroxide). The substrate may also be cleaned and/or oxidatively modified by exposure to UVO, to a plasma such as an argon plasma or other plasma, or to other chemical treatments. It may also be desirable to treat the surface of the substrate with UVO immediately prior to contacting it with the oxidized elastomer. The treatment of the substrate may conveniently be carried out by subjecting the elastomer surface and the substrate surface to the same UVO exposure. For metal substrates such as gold, it may be useful to apply an adhesion promoter such as a thiol compound to the metal surface and/or the elastomer surface. Examples of thiol compounds include thiol-silane compounds such as (thiolpropyl)trimethoxysilane.

Ultraviolet radiation at 185 nm is believed to convert oxygen into ozone, which is subsequently converted to atomic oxygen by UV radiation at 254 nm. Without wishing to be bound by any theory of interpretation, it is believed that oxidation of the silicon-containing surface of the elastomer serves to form free silicon-oxide (Si—O—) and/or silicon-hydroxide (Si—OH) functionalities on the surface due to the removal of organic groups by cleavage of the initial silicon-oxygen-carbon (Si—O—C—) or silicon-carbon (Si—C) bonds. Contact between the oxidized elastomer and the substrate is believed to foster the formation of silyl ether (Si—O—Si, Si—O—C, or Si—O-metal) bonds between the two materials.

The amount of UVO treatment may be varied depending on the type of silicon-containing elastomer and the type of substrate material. For example, for polysiloxanes containing alkyl or aryl organic side groups which are less volatile than the methyl groups of PDMS, the UVO may need to be applied for more than 5 minutes. Also, for silicon-modified elastomers and polysiloxane-containing block copolymers, an increased duration of UVO may be needed, since the silicon atoms are less concentrated than in PDMS. PDMS elastomer which has been treated with UVO for 5 minutes or more may not adhere to a substrate irreversibly, and treatment for 4 minutes may yield adhesion which is inconsistent from one sample to another. Other silicon-containing elastomers may also exhibit this "overoxidation" phenomenon and thus will have a maximum effective UVO treatment time.

In addition to being irreversibly attached to a substrate, the oxidized surface of a silicon-containing elastomer can be adhered to a transfer pad material such that the attachment is removable. A silicon-containing elastomer can be adhered to a transfer pad with a bond which is sufficiently strong to allow for manipulation of the elastomer, but which is less strong than the cohesive forces within the elastomer. Thus, the removable attachment between a silicon-containing elastomer and a transfer pad can allow the elastomer to retain its desired shape during storage and/or other processing, but the elastomer can be completely removed from the transfer pad when they are pulled away from each other with a sufficient force. Preferably, this removal is accomplished without tearing the elastomer and/or the transfer pad (cohesive failure).

The removable attachment of a silicon-containing elastomer to a transfer pad may be facilitated by the combination of oxidation of the surface of the elastomer and deposition of an adhesion control agent on the oxidized surface. For example, the surface of a silicon-containing elastomer can be oxidized and then exposed to an adhesion control agent such that at least some of the adhesion control agent is present on the surface. Contacting this modified surface with a transfer pad can then provide the elastomer and the transfer pad connected by a removable attachment.

Adhesion control agents can be any substance which, when present on an oxidized surface of a silicon-containing elastomer, reduces the strength of the bond between the oxidized surface and another material. Adhesion control agents may include, but are not limited to, surface active agents such as ionic and non-ionic surfactants, silane compounds such as a trichlorosilane containing an organic substituent, siloxane compounds such as a cyclic methylsiloxane containing an organic substituent. Preferred adhesion control agents include trichlorosilanes containing an organic substituent having from 3 to 20 carbon atoms. More preferred adhesion control agents include trichlorosilanes containing a fluorinated organic substituent having from 3 to 20 carbon atoms and from 1 to 41 fluorine atoms. A specific preferred adhesion control agent is (tridecafluoro-1,1,2,2-tetrahydrooctyl) trichlorosilane, hereinafter referred to as TDTS.

Removable attachment may also be facilitated by a stimulus-responsive adhesive layer between the elastomer and the transfer pad. The adhesive layer can provide an irreversible attachment between the adhesive layer and the silicon-containing elastomer and between the adhesive layer and the other material, but can be made to reduce the strength of attachment to the elastomer and/or the other material. For example, a layer of adhesive material may be subjected to a change in conditions such as temperature, irradiation or electric field such that the adhesive strength is reduced. In one example, a photoresist material such as poly(methyl methacrylate), poly($\alpha$-methylstyrene), poly(norbornene-co-maleic anhydride), or phenol-formaldehyde can initially provide an adhesive bond between the materials. These materials may then be degraded by irradiation to sufficiently reduce the strength of adhesion and to allow the materials to be separated. Such photoresist-based reversible adhesion may also include the use of a photosensitizer such as a photoacid generator to improve the response time for the reduction in adhesive strength.

Suitable transfer pad materials include, but are not limited to, silicon, silicon oxide, quartz and glass, as well as silicon-containing elastomers such as PDMS. Preferably, the transfer pad is a silicon-containing elastomer. More preferably, the transfer pad is PDMS.

The irreversible attachment of a silicon-containing elastomer to a substrate can be used to transfer a film of the elastomer onto the substrate. For example, oxidation of a surface of the silicon-containing elastomer, followed by contacting and bonding the oxidized surface with a substrate can form an irreversible attachment between the elastomer and the substrate. Preferably, the irreversible attachment is stronger than the cohesive forces within the elastomer. Although the elastomer is a unified, continuous material, it can be regarded as containing a bulk portion which is not adjacent the oxidized surface, and a surface layer portion which is adjacent the oxidized surface. Thus, if the elastomer is pulled away from the substrate, the elastomer will undergo cohesive failure, separating the bulk portion from the surface layer portion. Preferably, the cohesive failure is such that a film of elastomer material remains bonded to the substrate only in regions where the elastomer surface has been oxidized and then placed in contact with the substrate.

The irreversible attachment of a silicon-containing elastomer to a substrate can also be used to transfer a pattern from a master to a substrate. For example referring to FIG. 1, the silicon-containing elastomer can be patterned based on a master pattern 20. The master pattern may be present on a surface of a master material 22. Formation of the final silicon-containing elastomer 30 on this patterned surface can form a relief of the pattern in the elastomer. Silicon-containing elastomers can be formed, for example, by polymerizing monomers and/or prepolymers; by crosslinking monomers, prepolymers and/or polymers; and by solidifying the elastomer from a liquid or molten state. Thus viscous elastomer precursors, such as monomers, prepolymers or uncrosslinked polymer, can be deposited onto the patterned surface of a master. Polymerization and/or crosslinking can then provide the patterned silicon-containing elastomer, which can be removed from the master. Also, an elastomer that is at a temperature above its melting temperature ($T_m$) can be deposited onto the patterned surface of the master.

Once the elastomer has cooled sufficiently below its $T_m$, it can be removed from the master to reveal the patterned elastomer. When transferring a pattern using irreversible attachment and cohesive failure, it is preferred that the material used to make the patterned silicon-containing elastomer is deposited on the master in an amount sufficient to cover the entire master pattern.

The master can be patterned by any number of known microfabrication techniques and can be made of a variety of materials. Preferably, the master is cleaned before deposition of material that is used to make the patterned elastomer. It is also preferred that the master not contain substances which can be transferred to the surface of the patterned elastomer, such as contaminants, lubricants, salts, particulates, small molecules, or oligomers.

Referring still to FIG. 1, once the patterned silicon-containing elastomer has been produced, based on the master pattern, it is removed 40 from the master. The patterned surface 32 of the elastomer can then be oxidized 42 and irreversibly bonded 44 to a substrate 50, as described. The substrate and the silicon-containing elastomer are thus irreversibly attached along the pattern as dictated by the master pattern. When the bulk of the elastomer 34 is pulled away 46 from the substrate, the elastomer will undergo cohesive failure, leaving a film 36 of elastomer material bonded to the substrate only in regions where the elastomer surface has been oxidized and then placed in contact with the substrate. Since the elastomer and the substrate are irreversibly attached in the shape of the pattern, the residual film on the substrate retains this pattern.

The yield strength of the patterned elastomer as it is peeled from the substrate can be affected both by the total elastomer contact area and by the feature sizes. Thus, the patterning method based on cohesive failure is especially useful for transferring patterns with small feature sizes (100 μm or smaller) over relatively large areas. One advantage of this method is that it can transfer patterns in a manner that allows registration of multiple patterns and that enables micron scale patterning over large areas. The locus of the cohesive failure of the elastomer progressively approaches that of the surface of the features as their sizes approach the 1 micron level. Pattern transfers in a thickness range of 10–100 nm can be attained easily for a 1.0 μm minimum feature size, based on a master with a 1 μm feature height as a specific example. The removal of the bulk elastomer for these small features sizes also tends to require a lower amount of force.

The removable attachment of a silicon-containing elastomer with a transfer pad can also be used to transfer a film of the elastomer onto a substrate. In this method, both surfaces of the silicon-containing elastomer are oxidized, but for different effects. For example, oxidation of one surface of the silicon-containing elastomer film, followed by deposition of an adhesion control agent, can allow that surface to be removably attached to another material. Contacting this surface with a transfer pad can form a removable bond between the elastomer film and the transfer pad. Once this surface is removably attached to the transfer pad, oxidation of the other surface of the silicon-containing elastomer film followed by bonding this oxidized surface with a substrate can form an irreversible attachment between the elastomer film and the substrate. This results in a layered structure having the silicon-containing elastomer film situated between the substrate and the transfer pad. If the transfer pad is pulled away from the substrate, the removable bond will be broken, and the irreversible bond will keep the film in contact with the substrate. Thus, the film is transferred from the transfer pad to the substrate. For removable attachment achieved with a stimulus-responsive adhesive, the adhesive is subjected to appropriate conditions to reduce the adhesion before the transfer pad is removed. Preferably, the separation of the transfer pad and the substrate is such that a film of elastomer material remains bonded to the substrate only in regions where the elastomer surface has been oxidized and then placed in contact with the substrate.

The transfer pad may be a solid material before it is contacted with the elastomer film, or the transfer pad may be formed directly on the elastomer film after the surface has been oxidized and treated with adhesion control agent. The formation of the transfer pad on the oxidized and treated surface is especially useful when the transfer pad is a silicon-containing elastomer. Thus, a viscous elastomer precursor can be deposited on the oxidized and treated film surface and allowed to solidify into an elastomeric transfer pad. The elastomeric transfer pad will then be removably attached to the film upon formation of the transfer pad.

In an example of the formation of an elastomeric transfer pad on an oxidized and treated film, initiated PDMS precursors can be deposited on a film surface and allowed to polymerize into a PDMS elastomer. Typically, when initiated PDMS precursors are added to a portion of PDMS which has already been cured, for example an elastomer film, the newly formed layer cures without the formation of a measurable boundary between the layers. Thus, the "adhesion" between the layers is the bulk, internal adhesion, which is relatively strong. If the surface of the cured PDMS film has been treated with an adhesion control agent without oxidation, the adhesion between the film and the transfer pad layer will be less than the bulk adhesion, allowing the layer and the film to be separated without causing damage to either layer. The adhesion can be reduced further by exposing the cured PDMS film to UVO before depositing an adhesion control agent.

For a cured PDMS film that is subjected to UVO, the strength of adhesion can thus be controlled by adjusting the amount of adhesion control agent, with increased amounts of adhesion control agent correlating to decreased adhesion strength. For example, a cured PDMS film that is subjected to 50 seconds of UVO followed by 20 minutes of exposure to TDTS exhibits minimal adhesion to a PDMS transfer pad. A reduction in the TDTS exposure provides for removable attachment to the PDMS transfer pad, and the film is thus supported across the entire film-transfer pad interface, allowing the exposed surface of the film to be brought into contact with a substrate without tearing, sagging, or folding of the film. The strength of adhesion can also be controlled by changing the level of exposure to UVO before the addition of an adhesion control agent. If the type and amount of adhesion control agent is unchanged, an increase in the UVO treatment time can provide for a reduction in the adhesion strength.

When combined with irreversible attachment of a silicon-containing elastomer to a substrate, the removable attachment of a silicon-containing elastomer to a transfer pad can also be used to transfer a pattern from a master to a substrate. For example, the silicon-containing elastomer can be patterned based on a master pattern, where the master and the elastomer precursors are as described above.

Figure 2:
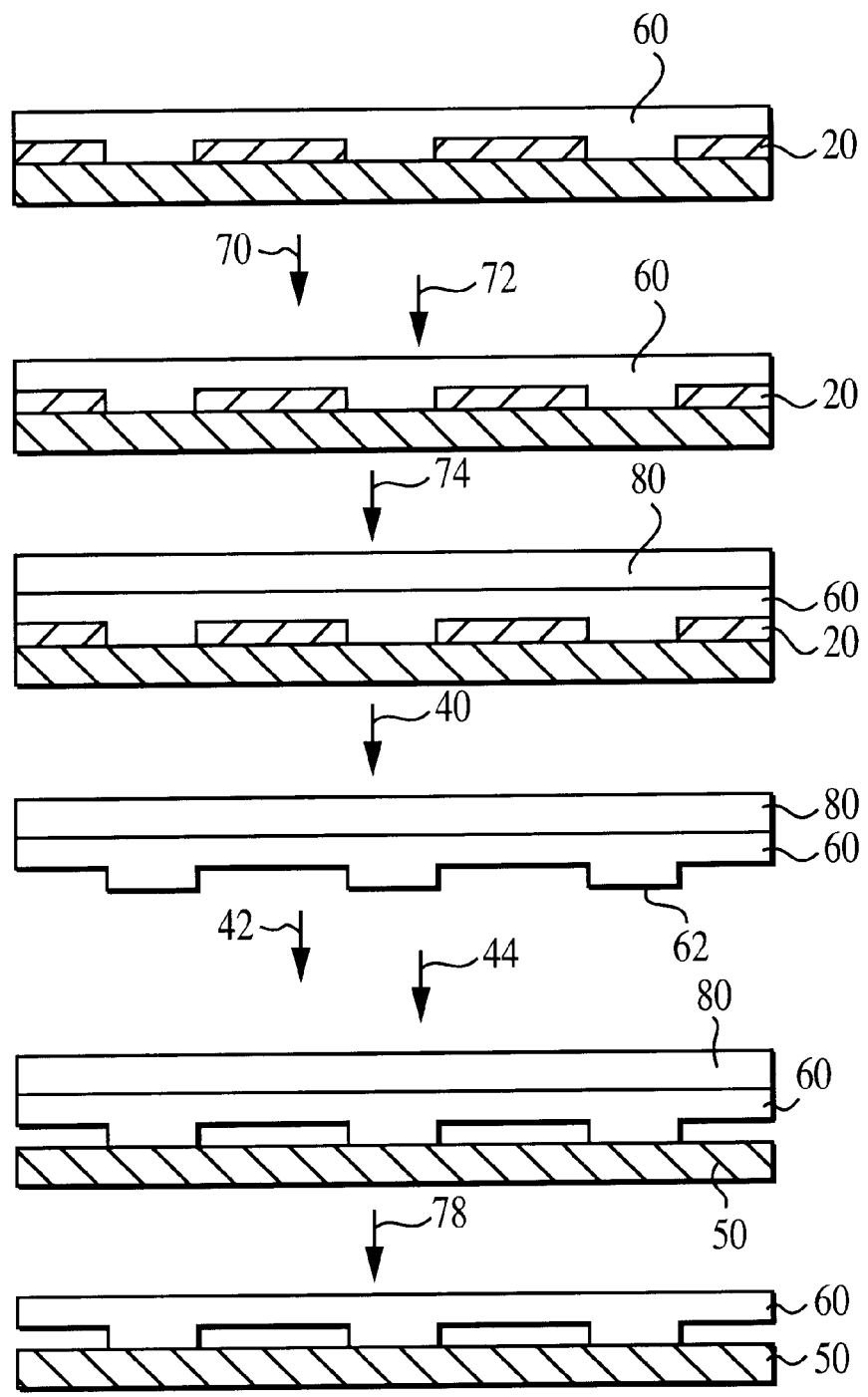
FIG. 2 is a diagram of a closed pattern transfer method using irreversible attachment and removable attachment.
Figure 3:
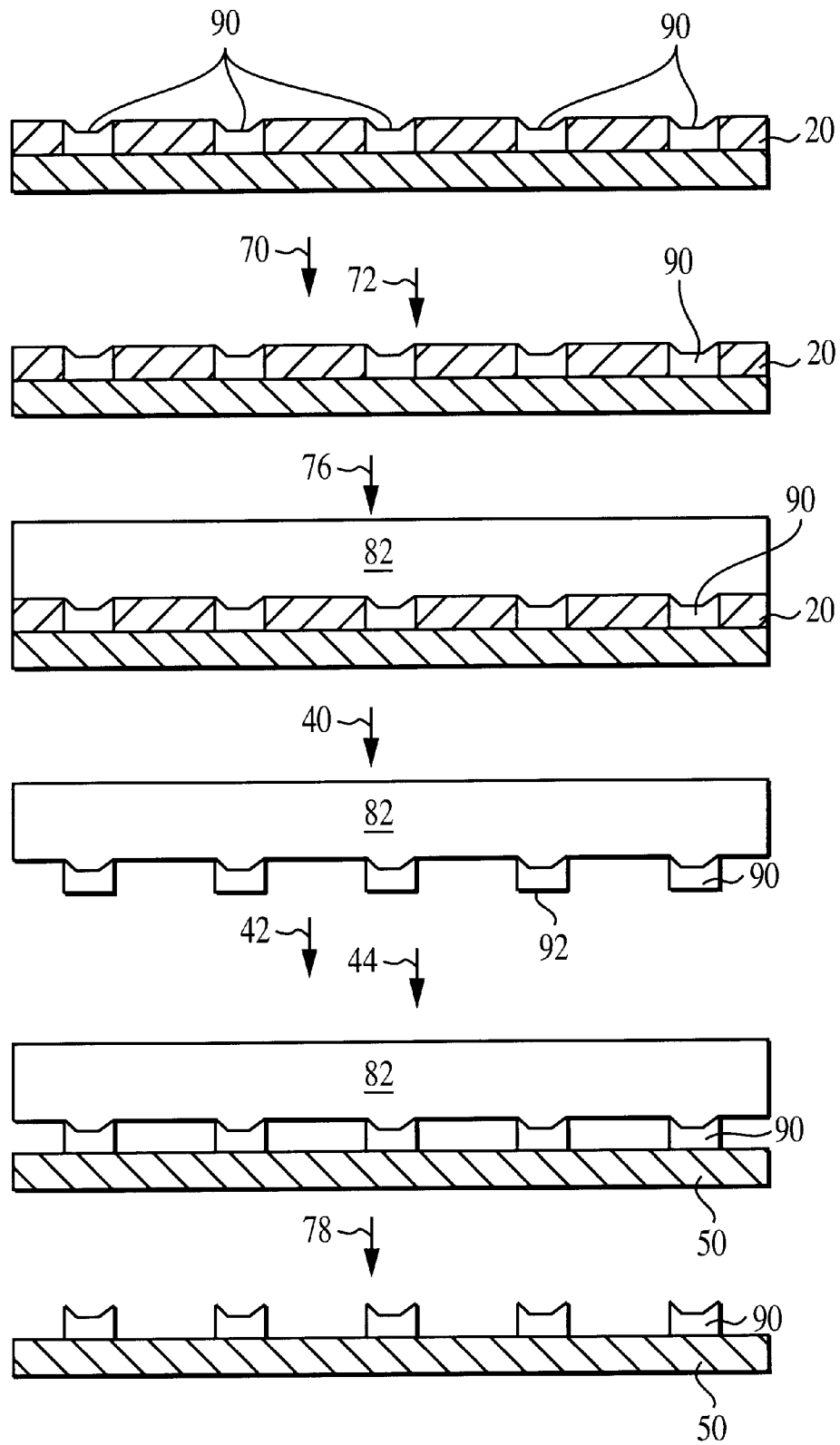
FIG. 3 is a diagram of an open pattern transfer method using irreversible attachment and removable attachment.

Referring to FIGS. 2 and 3, the material used to make the patterned silicon-containing elastomer film may be deposited on the master in an amount sufficient to cover the entire master pattern, or it may be deposited in an amount that fills the pattern in the length and width dimensions but not in the height dimension. Referring to FIG. 2, in the first situation a continuous film of the elastomer 60 covers the entire master pattern 20. Once the exposed continuous film surface is oxidized 70 and treated with an adhesion control agent 72, a transfer pad material 80 may be applied 74, in the form of a pre-solidified material or as an elastomer precursor that then solidifies. Referring to FIG. 3, in the second situation, the top of the master pattern 20 is exposed, and the elastomer film 90 may be continuous or discontinuous. This elastomer film and the exposed portions of the master can then be subjected to oxidation conditions 70, followed by an adhesion control agent 72. Deposition of an elastomer precursor 76 allows a solid elastomer 82 to be formed that is removably attached to the patterned elastomer film 90.

Referring to both FIGS. 2 and 3, once the film (60 or 90) is removably attached to the transfer pad (80 or 82), the film and transfer pad can be separated 40 from the master to expose the other surface of the film (62 or 92). This exposed surface, which has been patterned based on the master pattern, can then be oxidized 42 and bonded 44 to a substrate 50, as described. The substrate and the silicon-containing elastomer are thus irreversibly bonded along the pattern as dictated by the master pattern. When the transfer pad (80 or 82) is pulled away 78 from the substrate, the removable attachment will be broken, leaving a film (60 or 90) of elastomer material bonded to the substrate only in regions where the elastomer surface has been oxidized and then placed in contact with the substrate. If the removable attachment is provided by a stimulus-responsive adhesive between the elastomer and the transfer pad, the oxidation 70 and adhesion control treatment 72 may be substituted with a deposition of the stimulus-responsive adhesive. Also, once the pattern has been oxidized 42 and irreversibly bonded 44, the adhesive is subjected to appropriate conditions to sufficiently reduce the strength of attachment between the transfer pad (80 or 82) and the film (60 or 90) before removing 78 the transfer pad from the substrate.

Since the elastomer and the substrate are irreversibly bonded in the shape of the pattern, the residual film on the substrate retains this pattern. For patterned films formed by covering the master with a continuous film, the pattern will be a closed pattern, with spaces bounded on all sides by the substrate and the elastomer film. In one example, these spaces form empty channels which may be discrete, or which may be interconnected. For patterned films formed by leaving the top of the master pattern exposed, the pattern will be an open pattern containing exposed regions of the substrate.

The use of a bulk PDMS transfer pad for the elastomer film during the pattern transfer enables microfabrication of structures not previously accessible, including discrete open-form patterns. Furthermore, this method can transfer patterns with excellent precision and can also allow for registration of elastomer patterns with other substrate features, since elastomeric films can be readily manipulated. The film thickness can be controlled over a very wide range, and is not limited in pattern sizes, array sizes, or line widths that can be reproduced. The flexibility of the pattern and the transfer pad also allow for patterning on non-planar substrates. For example, patterns can be formed on concave or convex surfaces, such as lenses.

The pattern transfer methods of the present invention allow the deposition of precisely designed polymer thin-films with a remarkable range of feature sizes. Minimum feature sizes in these patterns may be less than 1,000 micrometers. Preferably, minimum feature sizes are from 1 nanometer to 500 micrometers, and more preferably from 10 nanometers to 100 micrometers. For closed form patterns covered by a silicon-containing elastomeric membrane, the top membrane layer may have a thickness from multiple millimeters to the order of nanometers. Preferably, the top layer thickness is from 500 micrometers to 100 nanometers, and more preferably from 100 micrometers to 500 nanometers.

Designs can be formed which may be open or closed, three dimensionally patterned structures, and which may be continuous or discontinuous. This technique may be used for a variety of soft lithographic applications, including the formation of microfluidic membranes and patterned etch resists.

EXAMPLES

Polydimethylsiloxane (PDMS) precursor was obtained from DOW CORNING (Midland, Mich.) as SYLGARD 184. Boron doped silicon wafers (<100>) were obtained from SILICON SENSE, INC. (Nashua, N.H.). (Tridecafluoro-1,1,2,2-tetrahydrooctyl) trichlorosilane (TDTS) was obtained from GELEST (Morrisville, Pa.). Fluorescein and all solvents were obtained from ALDRICH (Milwaukee, Wis.). Rhodamine B, sulfuric acid, hydrogen peroxide 30% were obtained from FISHER (Springfield, N.J.). Common solvents were also obtained from Fisher.

Silicon oxides were grown on silicon wafers under an ambient atmosphere by heating them to around 800° C. for several hours to give a ~2500 Å thick oxide layer. An apparatus employing a low-pressure mercury lamp (BHK, Claremont, Calif.) at 173 microwatts per square centimeter ($\mu W/cm^2$) was used as a UV source, and laboratory jacks were used to hold samples within a few millimeters of the bulb. Masters were produced as described in Deng et al., *Anal. Chem.* 73:3176–3180 (2000) and in Deng et al., *Langmuir* 15:6575–6581 (1999). Contact photolithography was used to make master patterns by patterning either AZ 5214 (CLARIANT, Sommerville, N.J.) or SU-8 5 (MICROCHEM, Newton, Mass.) photoresists, using 5080 dpi transparencies as an exposure mask. Solvents used in processing the samples were of analytical grade or higher and used without purification.

Opticalmicrographs were recorded using an OLYMPUS BH-2 optical microscope (OLYMPUS AMERICA, Melville, N.Y.) with PANASONIC GP-KR222 digital color camera (PANASONIC USA, Seacaucus, N.J.). Electron micrographs were recorded using either a ZEISS DSM 960 (CARL ZEISS, INC., Thornwood, N.Y.) or HITACHI S-4700 (HITACHI AMERICA, Tarrytown, N.Y.) scanning electron microscope (SEM). For the SEM samples, 6 nm of palladium/gold alloy was sputtered on them prior to examination to facilitate imaging. Fluorescent images were recorded using an OLYMPUS PROVIS AX70 optical microscope with an OLYMPUS UMWIB dichroic mirror assembly. This set-up using a 100 W Hg arc lamp to send excitation through a band-pass filter (470–505 nm) to excite a sample filled with a 0.01 mM fluorescein solution at pH 12. The emission from the sample then passes though a high-band pas filter (>515 nm) for capture by an ASAHI PENTAX K100 35 mm camera (PENTAX, Denver, Colo.) using KODAK COLOR WATCH film (EASTMAN KODAK, Rochester, N.Y.). All images shown are unprocessed. Surface feature heights were determined by surface profilometry using a SLOAN DEKTAK$^3$ ST (available from VEECO INSTRUMENTS, Histon, Cambs, United Kingdom).

Example 1

Sample Preparation and Adhesive Treatment

PDMS molds and stencils were prepared as recommended by DOW CORNING in the SYLGARD 184 kit by mixing the oligomer and initiator in a 10:1 ratio. The recommended procedure was modified by reducing the pressure (50 torr) at room temperature for several minutes with a vacuum oven to remove entrained gas bubbles. The prepolymer mixture was cast onto a master, and, after waiting 10 min for the mixture to level, the mixture was cured at 70° C. for two hours. The patterned PDMS elastomer was then extracted from the master, washed with ethanol, and dried under a stream of high purity nitrogen. Substrates were treated prior to pattern transfer. Silcon, thermally grown oxides, and quartz substrates were rinsed with hexanes and ethanol, dried with nitrogen, and exposed to UVO for 15 min prior to use. Glass slide substrates were cleaned in piranha (3:1 $H_2SO_4$: hydrogen peroxide 30%) for 5 min, rinsed thoroughly with deionized water, and dried under a stream of nitrogen. PDMS substrates were prepared by exposing the surface to UVO for 20 min and then waiting for 5–10 min before rinsing the surface with ethanol, and drying with nitrogen.

To irreversibly bond the silicon-containing elastomer to the substrate, the patterned surface of the PDMS was modified by exposing it to the ultraviolet lamp for 150 seconds. The modified surface was then brought immediately into contact with the cleaned substrate. While maintaining contact, the sample was heated in an oven at 70° C. for a minimum of 20 min.

Example 2

Patterning Using Irreversible Attachment

This patterning procedure follows from the bonding steps described above. After inducing adhesion between a molded PDMS elastomer and a silcon substrate, the elastomer pattern was transferred by using tweezers to grip one of the corners of the bulk of the elastomer. The bulk of the elastomer was then physically peeled off the substrate to leave a PDMS film of the pattern.

Figure 4A:
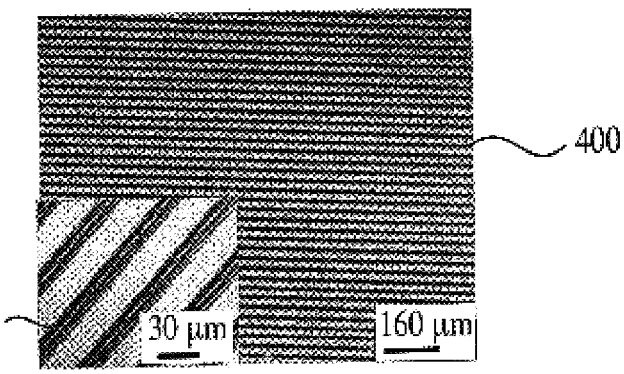
FIGS. 4a and 4c are images of elastomer patterns formed using irreversible attachment.
Figure 4B:
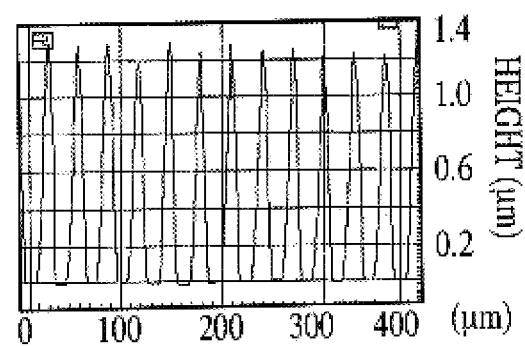
Figure 4C:
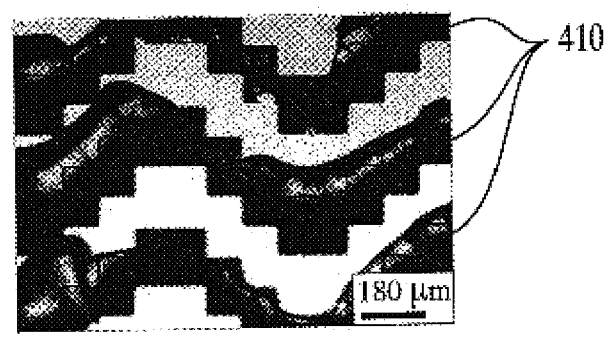

FIGS. 4a–c show two examples of PDMS patterns with very different sizes and design rules that were created in this way. The pattern shown in FIG. 4a was made by transferring PDMS lines 400 to a planar silicon substrate. The origin of this pattern was a master of coplanar lines that were 15 μm wide, with a depth of 1.5 μm and a line spacing of 20 μm. The image here reveals the cohesive failure caused by peeling the stamp off in a direction parallel to the lines, leading to a failure in the stamp near the regions where the surface features join the bulk of the PDMS. This catastrophic failure in the polymeric material led to necking of the elastomer, which distorted the shape of the original rectilinear contours of the stamp's structures. It is notable that, in the profilometry data shown in FIG. 4b, the deposited lines shared a uniformity of feature heights and spacing.

In FIG. 4c, a pattern having a larger line-width but with the same amount of PDMS surface coverage as the pattern in FIG. 4a, required a larger force to peel the elastomer from the substrate. This pattern was based on contoured 180 μm lines 410 with 180 μm line-widths, a depth of 8.6 μm, and a pitch of one. The stamp was peeled off in a direction perpendicular to the lines. The pattern is precisely reproduced at the elastomer-substrate interface, although overhanging portions were also formed.

Figure 5A:
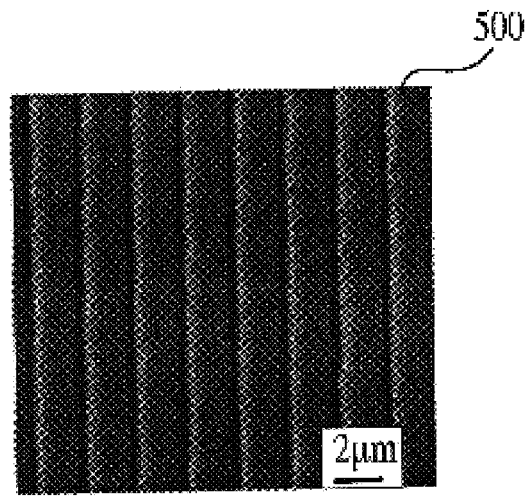
FIGS. 5a–c are images of elastomer patterns formed using irreversible attachment.
Figure 5B:
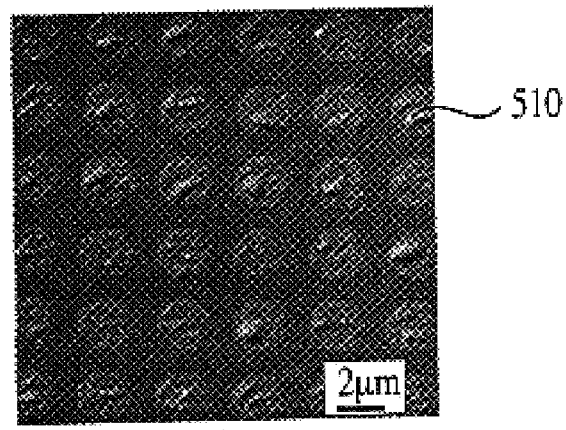
Figure 5C:
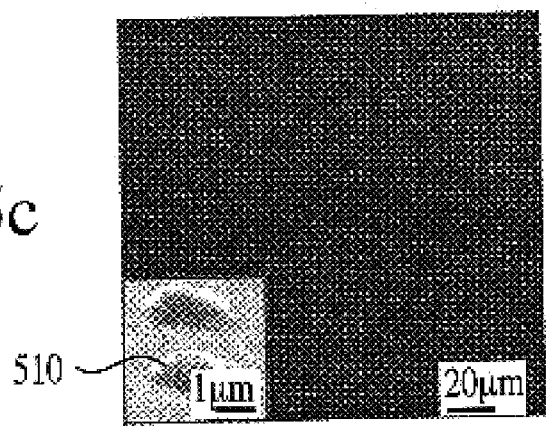
Figure 6A:
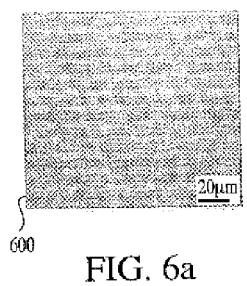
FIGS. 6a–d are images of open patterns formed using irreversible attachment and removable attachment.
Figure 6B:
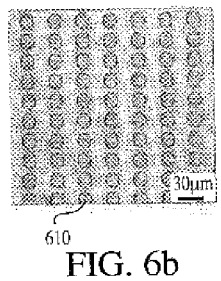
Figure 6C:
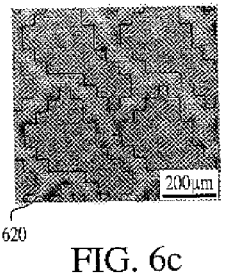
Figure 6D:
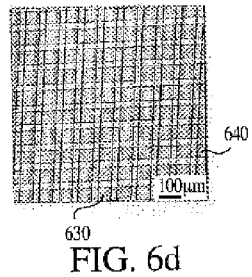

Examples of small feature patterning with PDMS are also shown in FIGS. 5a–c. FIG. 5a shows a set of lines 500 1 μm thick with a pitch of one, which was patterned by this method. This pattern has a well-defined height profile, and the line heights are well centered on a sub-micron level across the array. FIG. 5b shows a 2.5×2.5 cm pattern derived from a master having of a square array of holes, providing PDMS circles 510 2 μm in diameter and 1.5 μm deep, with a 2.7 μm center-to-center separation. No thinning of the PDMS below a 10 nm thickness was observed, and this thickness permits the pattern to be used as a resist for silicon processing by both wet etching and reactive ion etching. This same pattern is shown with a larger field of view in FIG. 5c. It is remarkable that very few defects are seen in the entire 6.25 $cm^2$ area of the pattern.

These results clearly show that this method can produce PDMS structures with micron scale features sizes over very wide substrate areas with few gross defects. In fact, submicron design rules should be easily accommodated by this method as well.

Example 3

Patterning by Removable and Irreversible Attachment

This patterning procedure involves the formation of a well-defined layer of PDMS that is bound to a transfer pad layer that has specifically engineered release properties. The procedure used for either open patterning or closed patterning is identical except for the limits adopted in the initial spin-casting of the prepolymer mixture onto the master. The height of the features on the master is known before the prepolymer is deposited, and the amount of prepolymer used can be adjusted to provide for open patterns or closed patterns. For open patterns, the PDMS prepolymer was deposited in an amount such that the top of the mixture was below the feature height of the master. For closed patterns, the prepolymer was deposited in an amount such that the top of the mixture was above the feature height of the master. After spin-casting of the PDMS prepolymer, both types of decals were cured at 70° C. for 30 min.

The PDMS thin-film was then modified for reversible attachment by exposing the film, while still on the master, to UVO for 3 min, holding it only a few millimeters from the UV source. The film was then placed in a dry atmosphere container with an open vial of (tridecafluro-1,1,2,2-tetrahydroctyl) trichlorosilane (TDTS) at room temperature for 20 min, and was then covered with an additional, thicker layer of the PDMS prepolymer which was cured in place at 70° C. for 2 hrs. The composite replica was extracted from the master using a scalpel to cut around the pattern's edge. The master was reusable for further patterning. Using the substrate and stamp preparation described in Example 2, irreversible adhesion was induced between the two by exposing the patterned thin-film surface to UVO for 150 s, and placing the stamp in contact with the substrate during curing at 70° C. for twenty minutes. In the last step, the transfer pad layer is easily removed at a remote corner with tweezers to uncover the decal.

FIGS. 6a–d illustrate a variety of continuous, open form PDMS patterns. Such designs are obtained by spin casting the first application of the PDMS prepolymer below the height of the features on the master (see FIG. 3). The silicon supported structures shown in FIG. 6a, a continuous open form pattern of lines 600 that were 5 μm in width with a pitch of one, were deposited by diluting PDMS prepolymer 4:1 with toluene and spin-casting this mixture to a thickness of 600 nm on a master with 5 μm high features. The structure shown in FIG. 6b was produced by spin-casting the PDMS prepolymer to a thickness of 2.8 μm on a master containing circular posts that were 5 μm tall and 10 μm wide, to form a pattern having 10 μm wide circular holes 610. The pattern 620 on a thermal oxide substrate, shown in FIG. 6c, used a prepolymer cast to a thickness of 8 μm on a master bearing features 13 μm tall. Finally, the composite set of PDMS lines shown in FIG. 5d illustrates a set of continuous, open form 70 μm wide lines 630 with 20 μm spacings, which were deposited perpendicularly upon an identical set of lines 640 previously deposited on silicon. Each level used PDMS lines that were 8 μm thick.

Figure 7A:
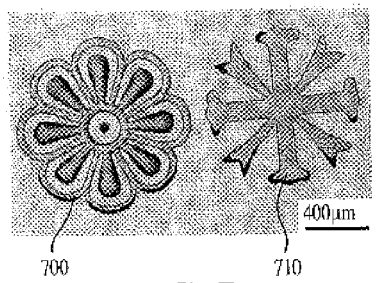
FIGS. 7a–c are images of non-continuous patterns open patterns formed using irreversible attachment and removable attachment.
Figure 7B:
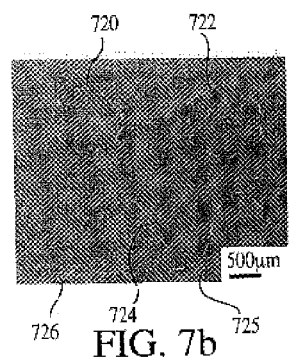
Figure 7C:
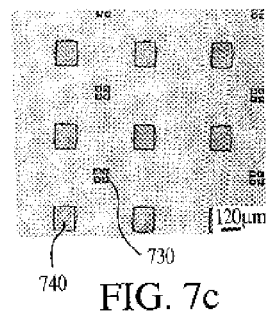

Examples of the design flexibility possible with this method are also shown in FIGS. 7a–c. Each of these non-continuous patterns was cast to around 8 μm on masters with feature heights averaging 13 μm. FIG. 7a is an example of symbols 700 and 710 printed at a font size of 8, which makes each thin-film pattern about 1 mm$^2$. This example demonstrates that elastomer film patterns can be released easily even when they incorporate very large areas of physical contact between the film and the substrate. The structures 720, 722, 724, and 726 shown in FIG. 7b were generated from a pattern derived from rectangles 725 that were 210 μm long and 50 μm wide, but with a range of spacings. The pattern shown in FIG. 7c demonstrates patterning of a range of features sizes and pitches in a single complex pattern. Square arrays of four 30 μm$^2$ squares 730 on 20 μm centers interpenetrates a larger square array of 120×140 μm rectangles 740 spaced by 420 μm centers.

Figure 8A:
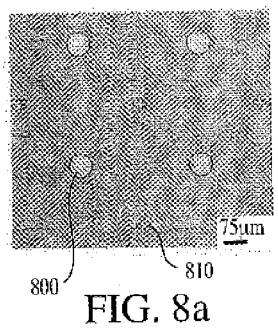
FIGS. 8a–c are images of closed patterns formed using irreversible attachment and removable attachment.
Figure 8B:
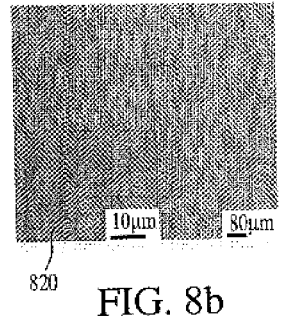
Figure 8C:
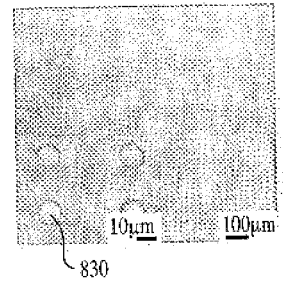

FIGS. 8a–c illustrate a variety of continuous, closed form PDMS patterns, obtained by spin casting the first application of the PDMS prepolymer above the height of the features on the master (see FIG. 2). The pattern shown in FIG. 8a was derived from a PDMS prepolymer deposited onto a master for a film thickness of 37 μm. Since the master's features were only 12 μm tall, the patterned is an interpenetrating, square array on 400 μm centers of 75 μm diameter cylindrical 800 and 40×10 μm cross-shaped 810 cavities, all of which are sealed under a 25 μm thick PDMS membrane. The examples shown FIGS. 8b and c were made from the same masters used to produce the patterns in FIGS. 6a and b respectively, except that the film was cast to a thickness of 7 μm, covering the 5 μm features of the master. These patterns have 5 μm empty channels 820 with a pitch of 1 and a rectangular array of 10 μm holes 830 with centers separated by 20 μm vertically and 30 μm horizontally, all covered by 2 μm thick membrane. These examples demonstrate remarkable design tolerances and capabilities for wide area patterning. The essentially defect free structures shown in FIGS. 8b and c are particularly promising for sensor applications based on microfluidic devices.

Example 4

Microfluidic Devices

Using a master with a continuous pattern of photoresist with a height of 12 micrometers (μm), freshly initiated PDMS pre-elastomer was spun-coat onto the master at 3×10$^3$ rpm for 40 seconds. The film was cured and treated with UVO and TDTS before being covered with a second layer of PDMS pre-elastomer as in Example 3. After the second layer had been cured, a metal leather-punch was used to form a hole in the PDMS structure, intersecting a single pre-designed capillary removed from the master. The patterned PDMS surface was irreversibly sealed to silicon. A 0.01 mM solution of fluorescein was syringed into the hole to form a reservoir of the dye. Using capillary outgas technique, the capillaries were filled with the fluorescein by applying vacuum for 1 min. When the vacuum was released, the capillaries filled either spontaneously or with mild agitation. A vertical cut was then made between the reservoir and the pattern, taking precautions not to cut so deep as to sever the capillary extending to the filled pattern. The PDMS transfer pad layer was peeled away, leaving a layer over the section containing the reservoir to prevent evaporation or reverse capillary action.

Additional levels were added to the microfluidic system by replicating these steps and transferring the patterned film to the top of the previously deposited film. The thicknesses of the elastomers covering any channel systems created by this method were found to be easily designed to range from essentially bulk dimensions (mm) to as little at 1 μm without tearing. The registration of the layers was followed using an optical microscope, and errors were corrected prior to the last heat treatment that provided the final binding.

Figure 9A:
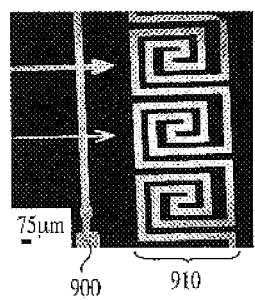
FIGS. 9a–c are images of microfluidic structures formed using irreversible attachment and removable attachment.
Figure 9B:
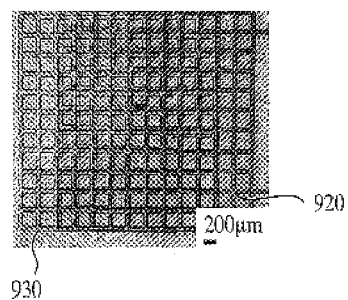
Figure 9C:
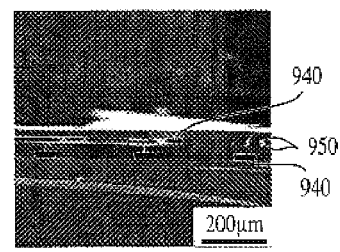

The examples presented in FIGS. 9a–c highlight patterns that allow for fabrication of membrane microreactors. FIG. 9a shows a portion of a large PDMS channel system with features varying from 20 μm wide empty channels 900 to 600 μm$^2$ square sections 910. The elastomer pattern used to construct this channel system had a height of 22 μm. Since the master's features were 12 μm high, this complex channel system is sealed by a membrane that is only 10 μm thick. FIG. 9b is an example of two identical microfluidic systems in a stacked configuration, with the bottom capillary system 920 filled with fluorescein and the top 930 filled with rhodamine B. Both systems were cast to a thickness of 23 μm over a 13 μm height profile master, and accordingly a permeable membrane with a thickness of only 10 μm separated the fluids in the two levels. The grid's channels were 75 μm wide with intersections spaced on 240 μm centers. Because of the device's large size, FIG. 9b is a composite of several micrographs combined to image the channels. FIG. 9c is a scanning electron micrograph (SEM) of a cross-section of a similar stacked channel system having 75 μm wide channels 940 with a height of 12 μm, covered with a 20 μm thick membrane 950.

Example 5

Silicon Pixel Fabrication

Figure 10A:
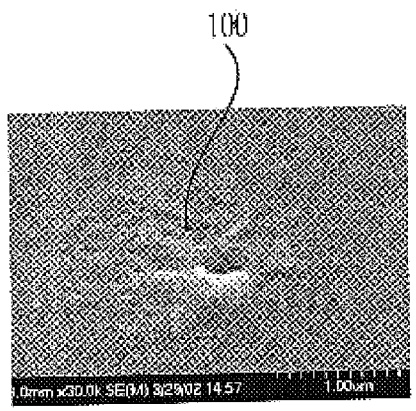
FIGS. 10a–d are images of the formation of silicon pixels on a substrate by subtractive lithography after pattern transfer.

Low-temperature reactive magnetron sputtering (RMS) was used to deposit amorphous silicon on glass slides, planar quartz substrates, and on piano-convex lenses. The film was deposited under argon at 1.5 mtorr for 20 minutes without heating, and surface profilometry indicated a film thickness of ~4000 Å. SYLGARD 184 was allowed to cure on a planar master to form an elastomeric mold of its master, as in Example 2. The elastomer was removed, and its patterned surface was modified by exposing it to UVO for 150 seconds and then placed immediately in contact with a pre-cleaned silicon-coated substrate. The substrate and the elastomer were then heated between 60–70° C. for 20 minutes. The PDMS was peeled off, leaving a patterned thin-film based on the areas of contact (FIG. 10a).

Figure 10B:
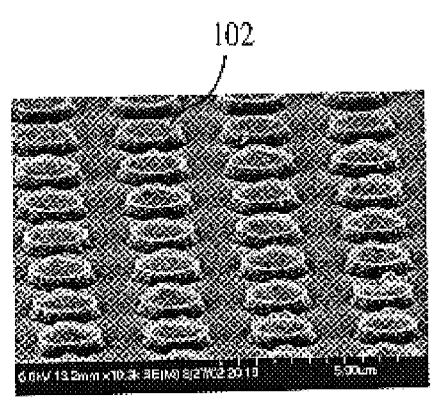
Figure 10C:
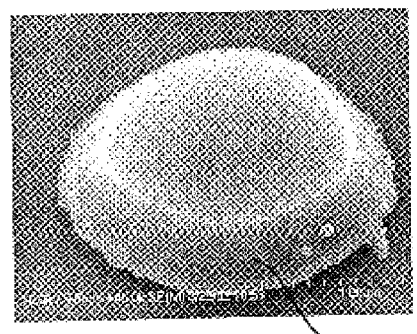
Figure 10D:
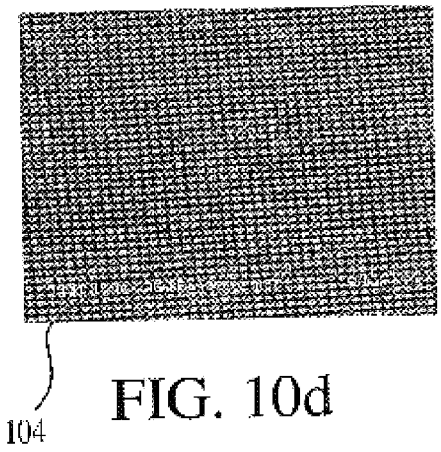

The substrate bearing the PDMS pattern was then etched in a parallel plate plasma chamber at 50 watts under 200 mTorr with 20 sccm of sulfur hexafluoride for 11 minutes to produce silicon pixels covered with PDMS resist 102 (FIG. 10b). The potential during etching was approximately 12V. The PDMS film was then removed by submerging the substrate for 30 s in 1M tetra-butyl ammonium fluoride (TBAF) in tetrahydrofuran (THF) to yield amorphous silicon pixels 104. Buffered HF (6:1 ammonium fluoride:HF) could also be employed, typically for 1 minute following etching to clean the surface and to differentiate the silicon and silicon oxide layers for SEM evaluation. The area patterned was 1 cm$^2$, but may be larger if desired. Approximately 5 nm of gold was sputtered onto the substrate to facilitate SEM imaging.

As imaged by SEM (FIG. 10), the PDMS film deposited on a planar quartz substrate had features approximately twomicrometers in diameter and having varying thicknesses and morphologies. In an effort to obtain anisotropic etching conditions, the chamber pressure was lowered to 30 mTorr, resulting in pixels with better side-wall ratios but with a loss in shape control. This decrease in chemical selectivity was most likely due to increased physical etching of the resist. In another attempt, 0.5 sccm of oxygen was added during the etching process in an attempt to passivate the sidewalls through oxidation. This small amount of oxygen oxidized the PDMS as expected, but also altered the etch characteristics, again leading to a loss of shape.

Referring to FIG. 10, the pattern features began as circular films 100 of 2 $\mu$m in diameter and maintained that diameter at the base throughout the etching process. The tops of the pixels 104 had an average diameter of 1.6, $\mu$m, since the side-wall ratio was only slightly better than unity. However this still gave an edge resolution of about 2000 Å, together with retention of shape and preservation of the silicon pixel's level top.

The removal of the PDMS film subsequent to patterning is important to most subtractive lithographic schemes. In the case of patterned PDMS films, 1 M TBAF/THF is capable of dissolving PDMS without any apparent effects on amorphous silicon or glass. This protects the integrity of the film and its support. Buffered HF was only used to illustrate the separation of silicon and glass in SEM imaging, but the PDMS film has not been able to resist this etchant for longer than a few minutes.

Silicon pixel arrays were also formed on non-planar substrates. A quartz lens was coated with a 4,000 Å thick layer of amorphous silicon, followed by a PDMS resist pattern on the amorphous silicon, as described for the planar substrates illustrated in the examples of FIGS. 10a–d. Amorphous silicon pixels were formed after etching and after removal of the PDMS resist.

Example 6

Additive Lithography of Metals

The patterns formed by the decal transfer methods, using irreversible attachment or using irreversible attachment together with removable attachment, can be used for additive lithography to deposit patterns of other materials onto a substrate. A PDMS pattern was irreversibly attached to a silicon substrate. The pattern was formed using the same master used to form the pattern shown in FIG. 8a, but depositing PDMS prepolymer such that an elastomer thickness of 5 $\mu$m was obtained. Removable attachment of this patterned PDMS layer to a transfer pad layer of PDMS, followed by irreversible attachment of the pattern to a silicon substrate and subsequent removal of the transfer pad layer (as in Example 3), provided a pattern containing cylindrical holes 75 $\mu$m diameter and arrayed on 400 $\mu$m centers; and these cylindrical holes were interpenetrated with 40×10 $\mu$m cross-shaped holes. Deposition of a 40 nm thick layer of a 60% palladium/40% gold alloy, followed by removal of the PDMS pattern, provided a metal pattern of circles and crosses on silicon. This technique was combined with the non-planar substrate patterning described in Example 5 to produce a metal pattern on a curved quartz lens. The pattern was formed of 1,000 Å thick gold, with a titanium adhesion layer between the quartz and the gold.

Example 7

Patterning on Other Substrates

The patterning techniques and the resultant additive lithography, subtractive lithography, andmicrofluidic fabrications already described and exemplified may also be applied to a variety of other substrates. A PDMS resist was formed on a 1.4 $\mu$m thick thermal oxide substrate. This resist contained circular holes having 75 $\mu$m diameters, and the thermal oxide was etched with a carbon tetrafluoride/oxygen plasma, followed by removal of the PDMS layer by treatment with 1 M TBAF/THF. These same techniques were used with a 0.8 $\mu$m thick thermal oxide substrate to produce a PDMS resist and subsequent patterned oxide.

A PDMS pattern was also formed on a gold substrate. For this gold/elastomer bonding, (thiolpropyl)trimethoxysilane was deposited between the gold and the oxidized elastomer before the gold was contacted with the oxidized elastomer and irreversibly bonded. The (thiolpropyl)trimethoxysilane can be applied to the oxidized elastomer, or it can be applied to the gold surface.

A PDMS pattern was also applied to a polystyrene substrate. The polystyrene substrate in this example was treated with an oxygen plasma before it was contacted with the oxidized elastomer and irreversibly bonded.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A method of making a microstructure, the method comprising:
    forming a pattern in a surface of a silicon-containing elastomer;
    oxidizing the pattern;
    contacting the oxidized pattern with a substrate; and
    bonding the oxidized pattern and the substrate such that the pattern and the substrate are irreversibly attached.

2. The method of claim 1, wherein the oxidizing comprises exposing the pattern to ultraviolet radiation and oxygen.

3. The method of claim 2, further comprising exposing the substrate to ultraviolet radiation and oxygen before contacting the pattern with the substrate.

4. The method of claim 1, wherein the bonding comprises maintaining contact between the pattern and the substrate for at least 16 hours.

5. The method of claim 1, wherein the bonding comprises maintaining the pattern and the substrate at a temperature of at least 70° C. for at least 20 minutes.

6. The method of claim 1, wherein the bonding comprises exposing the silicon-containing elastomer to ultraviolet radiation for at least 30 minutes.

7. The method of claim 1, wherein the silicon-containing elastomer comprises a member selected from the group consisting of polysiloxanes; block copolymers comprising segments of a polysiloxane; and silicon-modified elastomers.

8. The method of claim 1, wherein the silicon-containing elastomer comprises a polysiloxane.

9. The method of claim 8, wherein the silicon-containing elastomer comprises poly(dimethyl siloxane).

10. The method of claim 9, wherein the oxidizing comprises exposing the surface to ultraviolet radiation and oxygen.

11. The method of claim 10, wherein the exposing is carried out for between 1 minute and 4 minutes.

12. The method of claim 10, wherein the exposing is carried out for between 2 minutes and 3 minutes.

13. The method of claim 1, wherein the substrate comprises a member selected from the group consisting of silicon, silicon oxide, quartz, glass, a polymer, and a metal.

14. The method of claim 1, wherein the forming comprises depositing an elastomer precursor onto a master pattern;

allowing the elastomer precursor to solidify into the silicon-containing elastomer; and removing the silicon-containing elastomer from the master.

15. The method of claim 14, wherein the elastomer precursor comprises a member selected from the group consisting of monomers, prepolymers, and uncrosslinked polymers.

16. The method of claim 1, further comprising removably attaching the silicon-containing elastomer to a transfer pad, prior to oxidizing the pattern.

17. The method of claim 16, wherein the removably attaching comprises:

oxidizing the silicon-containing elastomer;

applying an adhesion control agent to the oxidized elastomer; and contacting the oxidized elastomer to a transfer pad material.

18. The method of claim 17, wherein the adhesion control agent comprises a member selected from the group consisting of ionic surfactants, non-ionic surfactants, silane compounds comprising an organic substituent, and siloxane compounds comprising an organic substituent.

19. The method of claim 17, wherein the adhesion control agent comprises a trichlorosilane comprising a fluorinated organic substituent having between 3 and 20 carbon atoms and between 1 and 41 fluorine atoms.

20. The method of claim 17, wherein the oxidizing the silicon-containing elastomer comprises exposing the elastomer to ultraviolet radiation and oxygen.

21. The method of claim 16, wherein the removably attaching comprises applying a stimulus-responsive adhesive between the silicon-containing elastomer and the transfer pad.

22. The method of claim 21, wherein a strength of attachment between the silicon-containing elastomer and the transfer pad is reduced by a change in a property selected from the group consisting of temperature, irradiation, or electric field.

23. The method of claim 21, wherein the stimulus-responsive adhesive is a photoresist material.

24. The method of claim 16, wherein the silicon-containing elastomer comprises a polysiloxane.

25. The method of claim 24, wherein the silicon-containing elastomer comprises polydimethyl siloxane).

26. The method of claim 1, further comprising applying an etching agent to the pattern and the substrate to remove a portion of the substrate which is not covered by the pattern: and removing the pattern.

27. The method of claim 1, further comprising depositing a material on the pattern and the substrate; and removing the pattern to provide a second pattern comprising the deposited material.

28. The method of claim 1, wherein the substrate is non-planar.

29. A method of making a microstructure, the method comprising:

oxidizing a first surface of a film comprising a silicon-containing elastomer;

wherein the first surface comprises a pattern, and the film is attached to a transfer pad;

contacting the pattern with a substrate;

bonding the pattern and the substrate such that the pattern and the substrate are irreversibly attached; and separating the transfer pad from the film.

30. The method of claim 29, wherein the transfer pad comprises a bulk portion of a silicon-containing elastomer which is continuous with the film;

the film is a surface layer of the silicon-containing elastomer; and the separating comprises inducing cohesive failure between the bulk portion and the film.

31. The method of claim 30, wherein the oxidizing comprises exposing the surface to ultraviolet radiation and oxygen.

32. The method of claim 30, wherein the substrate comprises a member selected from the group consisting of silicon, silicon oxide, quartz, glass, a polymer, and a metal.

33. The method of claim 30, wherein the silicon-containing elastomer comprises a polysiloxane.

34. The method of claim 33, wherein the silicon-containing elastomer comprises poly(dimethyl siloxane).

35. The method of claim 29, wherein the film and the transfer pad are removably attached through a bond formed by oxidizing a second surface of the film, treating the second surface with an adhesion control agent; and contacting the second surface with the transfer pad.

36. The method of claim 35, wherein the transfer pad comprises a second silicon-containing elastomer.

37. The method of claim 36, wherein the contacting the second surface with the transfer pad comprises forming the second silicon-containing elastomer on the second surface.

38. The method of claim 37, wherein the forming comprises depositing an elastomer precursor on the second surface, and allowing the elastomer precursor to solidify.

39. The method of claim 38, wherein the elastomer precursor comprises a member selected from the group consisting of monomers, prepolymers, and uncrosslinked polymers.

40. The method of claim 35, wherein the adhesion control agent comprises a member selected from the group consisting of ionic surfactants, non-ionic surfactants, silane compounds comprising an organic substituent, and siloxane compounds comprising an organic substituent.

41. The method of claim 35, wherein the adhesion control agent comprises a trichlorosilane comprising a fluorinated organic substituent having between 3 and 20 carbon atoms and between 1 and 41 fluorine atoms.

42. The method of claim 35, wherein the oxidizing a first surface and the oxidizing a second surface comprise exposing the first surface and second surface to ultraviolet radiation and oxygen.

43. The method of claim 35, wherein the substrate comprises a member selected from the group consisting of silicon, silicon oxide, quartz, glass, a polymer, and a metal.

44. The method of claim 35, wherein the silicon-containing elastomer comprises poly(dimethyl siloxane).

45. The method of claim 29, wherein the film and the transfer pad are removably attached through a layer of a stimulus-responsive adhesive.

46. The method of claim 29, further comprising applying an etching agent to the pattern and the substrate to remove a portion of the substrate which is not covered by the pattern; and removing the pattern.

47. The method of claim 29, further comprising depositing a material on the pattern and the substrate; and removing the pattern to provide a second pattern comprising the deposited material.

48. The method of claim 29, wherein the substrate is non-planar.

49. A method of making a microstructure, comprising;

oxidizing a silicon-containing elastomer;

contacting the oxidized elastomer with a portion of a substrate;

bonding the oxidized elastomer and the portion of the substrate to form a microstructure; wherein the elastomer is on the portion of the substrate, and the elastomer and the substrate are irreversibly attached; and applying an etching agent to the microstructure to remove a portion of the substrate which is not covered by the patterned silicon-containing elastomer.

50. The method of claim 49, further comprising removing the silicon-containing elastomer.

51. The method of claim 49, wherein the substrate is non-planar.

52. A method of making a microstructure, comprising:

oxidizing a silicon-containing elastomer;

contacting the oxidized elastomer with a portion of a substrate;

bonding the oxidized elastomer and the portion of the substrate to form a microstructure; wherein the elastomer is on the portion of the substrate, and the elastomer and the substrate are irreversibly attached;

depositing a material on the microstructure; and removing the silicon-containing elastomer to provide the deposited material on a portion of the substrate which was not covered by the silicon-containing elastomer.

53. The method of claim 52, wherein the substrate is non-planar.

* * * * *

UNITED STATES PATENT AND TRADEMARK OFFICE
CERTIFICATE OF CORRECTION

PATENT NO. : 6,805,809 B2
APPLICATION NO. : 10/230882
DATED : October 19, 2004
INVENTOR(S) : Nuzzo et al.

It is certified that error appears in the above-identified patent and that said Letters Patent is hereby corrected as shown below:

Column 19,
Line 63, delete "polydimethyl" and insert -- poly(dimethyl --.

Column 22,
Line 3, delete "patterned".

Signed and Sealed this

Fourth Day of July, 2006

JON W. DUDAS
*Director of the United States Patent and Trademark Office*